(12) United States Patent
Hu

(10) Patent No.: US 7,687,985 B2
(45) Date of Patent: Mar. 30, 2010

(54) DOUBLE-SIDED ORGANIC ELECTRO-LUMINESCENT DEVICE

(75) Inventor: Shuo-Hsiu Hu, Tainan (TW)

(73) Assignee: AU Optronics Corp., Hsinchu (TW)

( * ) Notice: Subject to any disclaimer, the term of this patent is extended or adjusted under 35 U.S.C. 154(b) by 390 days.

(21) Appl. No.: 11/379,076

(22) Filed: Apr. 18, 2006

(65) Prior Publication Data

US 2007/0164665 A1   Jul. 19, 2007

(30) Foreign Application Priority Data

Jan. 19, 2006   (TW) .............................. 95102040 A

(51) Int. Cl.
*H01J 1/62* (2006.01)
(52) U.S. Cl. ...................................... 313/504; 313/512
(58) Field of Classification Search ......... 313/501–512; 257/88
See application file for complete search history.

(56) References Cited

U.S. PATENT DOCUMENTS

2004/0245531 A1* 12/2004 Fuii et al. ..................... 257/88
2004/0263064 A1* 12/2004 Huang ......................... 313/504

* cited by examiner

*Primary Examiner*—Nimeshkumar D. Patel
*Assistant Examiner*—Mary Ellen Bowman
(74) *Attorney, Agent, or Firm*—Thomas, Kayden, Horstemeyer & Risley

(57) ABSTRACT

A double-sided organic electro-luminescent device. The device comprises a substrate having a first pixel region and a second pixel region adjacent thereto. First and second organic light-emitting diodes are disposed in the first and second pixel regions, respectively, in which the light-emitting direction of the first organic light-emitting diode is opposite that of the second organic light-emitting diode. First and second thin film transistors are disposed in the second pixel region, in which the first thin film transistor is electrically connected to the first organic light-emitting diode and the second thin film transistor is electrically connected to the second organic light-emitting diode.

7 Claims, 3 Drawing Sheets a second organic light-emitting diode. First and second thin film transistors are disposed in the second pixel region, in which the first thin film transistor is electrically connected to the first organic light-emitting diode and the second thin film transistor is electrically connected to the second organic light-emitting diode.

DOUBLE-SIDED ORGANIC ELECTRO-LUMINESCENT DEVICE

BACKGROUND OF THE INVENTION

1. Field of the Invention

The invention relates to a flat panel display (FPD), and in particular to an organic electro-luminescent device with prolonged lifetime.

2. Description of the Related Art

Organic electro-luminescent devices or organic light-emitting diodes (OLEDs) are active lighting devices using organic materials. Compared with conventional inorganic LEDs, OLEDs can be easily fabricated on a large substrate by forming an amorphous silicon layer thereon. Additionally, displays utilizing OLEDs require no backlight module, whereby the manufacturing process is simpler and costs are reduced. OLED technology is highly developed and can be employed in small panels such as those in personal digital assistants (PDAs) or digital cameras.

The organic electro-luminescent device typically comprises an anode, a cathode, and an organic light emissive layer disposed therebetween. The organic light emissive layer may comprise a hole transport layer (HTL) adjacent to the anode, an electron transport layer (ETL) adjacent to the cathode and an electro-luminescent layer interposed therebetween. When an electrical potential difference is applied between the anode and the cathode, electrons are injected into the electron transport layer from the cathode and pass through the electron transport layer and the electro-luminescent layer. At the same time, holes are injected into the hole transport layer from the anode and pass therethrough. The injected electrons and holes are recombined at the interface of the electro-luminescent layer and the hole transport layer, releasing energy as light.

Generally, organic electro-luminescent devices are applied in electronic products with a single-sided display. With the progress of electronic products, however, double-sided display has become required for many products, such as collapsible mobile phones. FIG. 3 is a plane view of a conventional double-sided organic electro-luminescent device. The organic electro-luminescent device 10 includes a substrate 11 having two adjacent pixel regions 12 and 14. A bottom-emitting OLED 16 and a thin film transistor 20 are disposed in the pixel region 12. A top-emitting OLED 18 and another thin film transistor 22 are disposed in another pixel region 14. The thin film transistor 20 is electrically connected to the OLED 16 and the thin film transistor 22 is electrically connected to the OLED 18.

However, in order to provide double-sided light emission, a single pixel region in the organic electro-luminescent device 10 must be divided into two pixel regions 12 and 14, thus the aperture ratio (AR) of the device 10 is reduced and in particular to the pixel region 12 that includes the bottom-emitting OLED 16. In order to maintain brightness of the organic electro-luminescent device 10, power consumption must be increased, thus reducing lifetime.

BRIEF SUMMARY OF THE INVENTION

A detailed description is given in the following embodiments with reference to the accompanying drawings. An embodiment of a double-sided organic electro-luminescent device comprises a substrate having a first pixel region and a second pixel region adjacent thereto. First and second organic light-emitting diodes are disposed in the first and second pixel regions, respectively, in which the light-emitting direction of the first organic light-emitting diode is opposite that of the

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
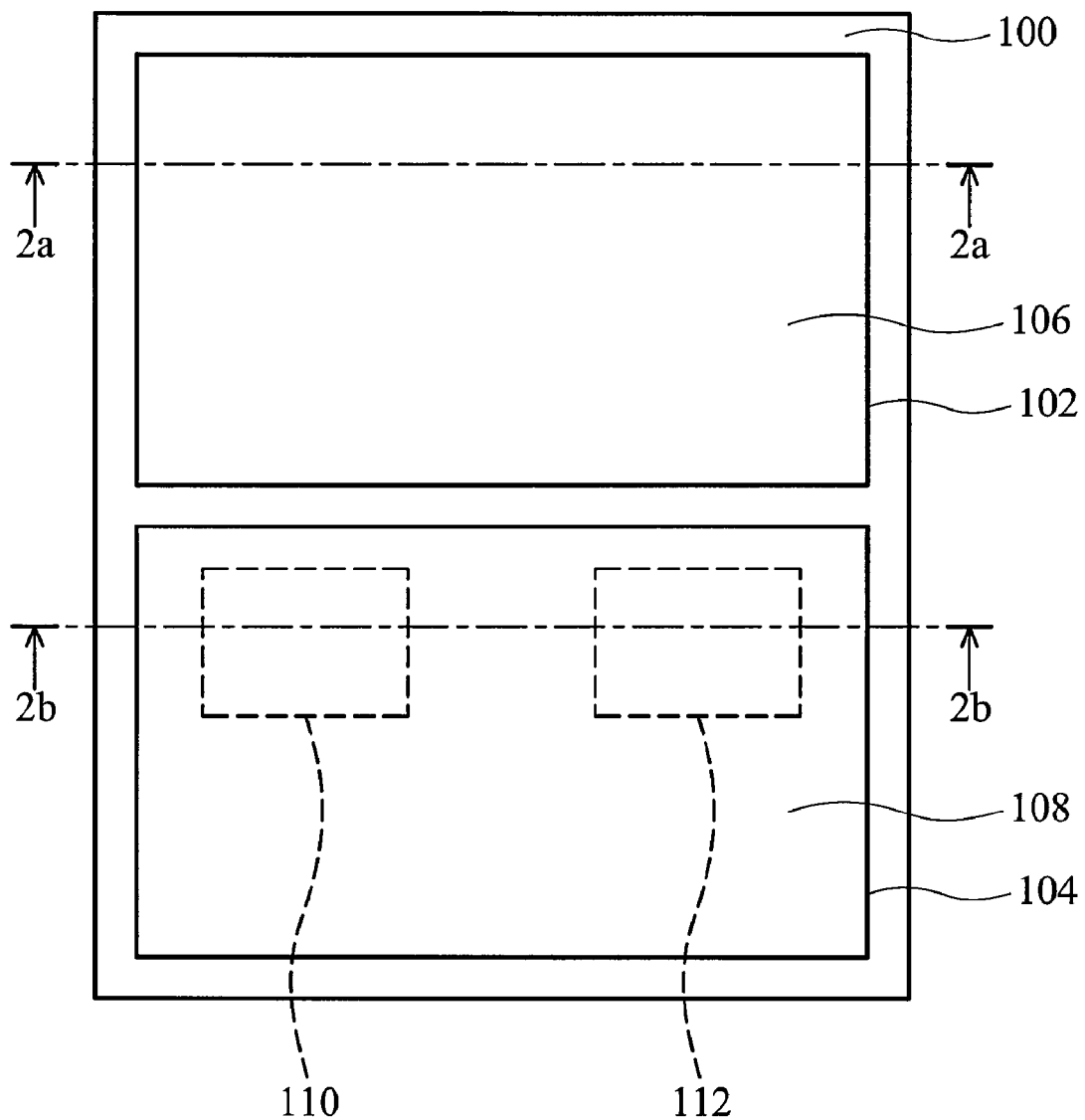
FIG. 1 is a plane view of an embodiment of a double-sided organic electro-luminescent device.
Figure 2A:
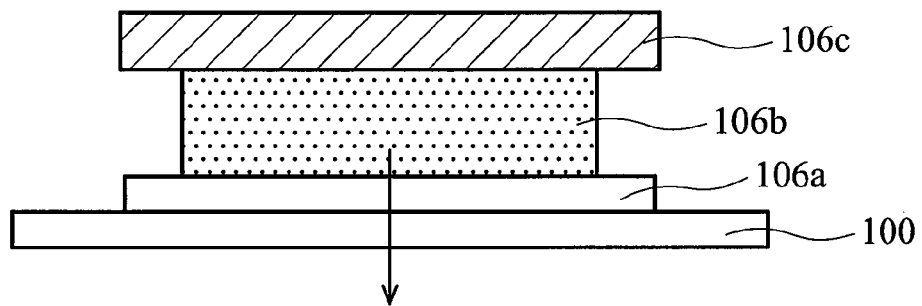
FIG. 2a is a cross-section along 2a-2a line in FIG. 1.
Figure 2B:
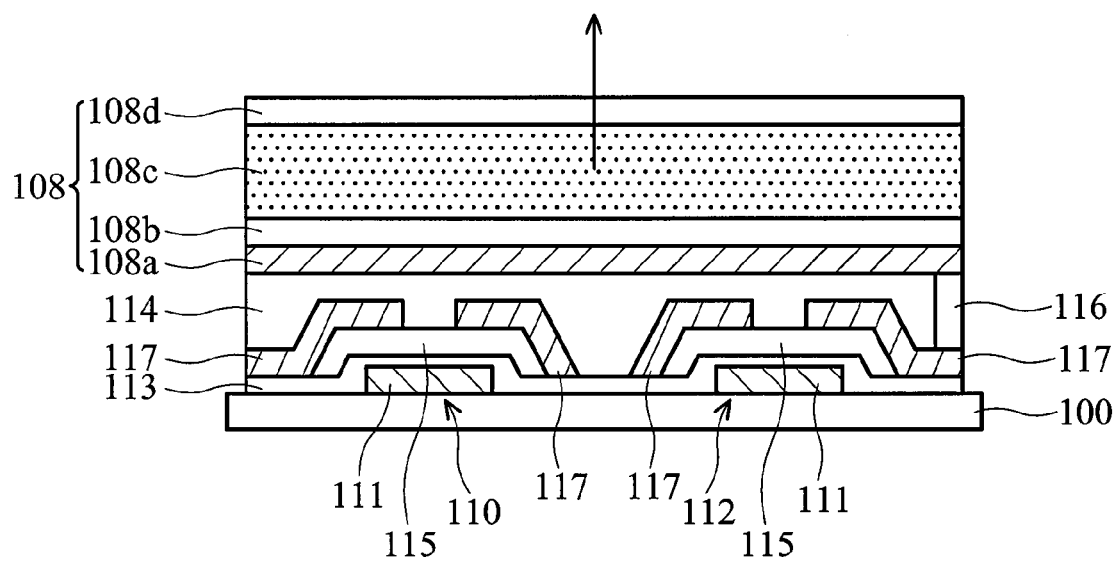
FIG. 2b is a cross-section along 2b-2b line in FIG. 1.
Figure 3:
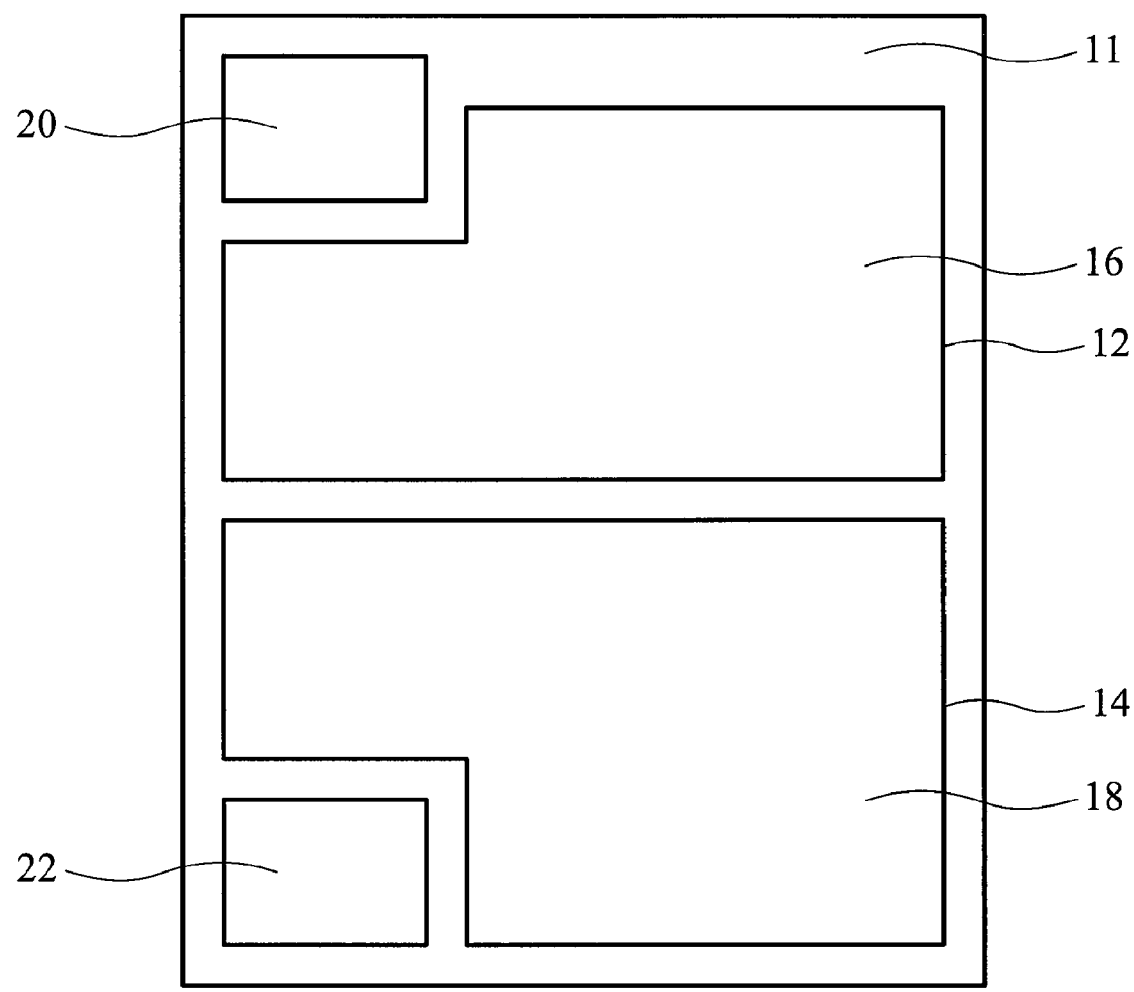
FIG. 3 is a plane view of a conventional double-sided organic electro-luminescent device.

The invention relates to an improved organic electro-luminescent device. FIGS. 1, 2a and 2b illustrate an embodiment of a double-sided organic electro-luminescent device, in which FIG. 1 is a plane view of a double-sided organic electro-luminescent device, FIG. 2a is a cross-section along 2a-2a line in FIG. 1 and FIG. 2b is a cross-section along 2b-2b line in FIG. 1. As shown in FIG. 1, the double-sided organic electro-luminescent device 200 comprises a substrate 100, such as a glass or quartz substrate, having a first pixel region 102 and a second pixel region 104 adjacent thereto. In this embodiment, a sub-pixel region consists of the first and second pixel regions 102 and 104 for displaying the same primary color, such as red, green or blue.

A first organic light-emitting diode 106 is disposed in the first pixel region 102. A second light-emitting diode 108 is disposed in the second pixel region 104. In this embodiment, the light-emitting direction of the first organic light-emitting diode 106 is opposite that of the second organic light-emitting diode 108. For example, the first organic light-emitting diode 106 may be a bottom-emitting organic light-emitting diode, comprising a transparent electrode 106a, an organic material layer 106b and a metal reflective electrode 106c. As shown in FIG. 2a, the transparent electrode 106a, comprising, for example, indium tin oxide (ITO) or indium zinc oxide (IZO), is disposed in the first pixel region 102 of the substrate 100. The organic material layer 106b is disposed on the transparent electrode 106a. The organic material layer 106b may comprise multiple layers comprising a hole transport layer (HTL), an electron transport layer (ETL) and an electro-luminescent (EL) or active layer interposed therebetween. Here, in order to simplify the diagram, only a single layer is depicted. The metal reflective electrode 106c is disposed on the organic material layer 106b. The metal reflective electrode 106c may comprise aluminum, silver, gold, nickel, chromium or other metal electrode material used in the art. Moreover, light is emitted toward the substrate 100 from the organic material layer 106b, as depicted by the arrow in FIG. 2a.

A second organic light-emitting diode 108 may be a top-emitting organic light-emitting diode, comprising a metal reflective electrode 108a, a first transparent electrode 108b, an organic material layer 108*b* and a second transparent electrode 108*d*. As shown in FIG. 2*b*, the metal reflective electrode 108*a* is disposed in the second pixel region 104 of the substrate 100, which may comprise aluminum, silver, gold, nickel, chromium or other metal electrode material used in the art. The first transparent electrode 108*b*, such as an ITO or IZO electrode, is disposed on the metal reflective electrode 108*a*. The organic material layer 108*c* is disposed on the first transparent electrode 108*b*. As mentioned, the organic material layer 108*c* may be multiple layers. In order to simplify the diagram, only a single layer is depicted. The second transparent electrode 108*d*, such as an ITO or IZO electrode, is disposed on the organic material layer 108*c*. Moreover, light is emitted toward the second transparent electrode 108*d* from the organic material layer 108*c*, as depicted by the arrow in FIG. 2*b*.

First and second thin film transistors 110 and 112 are disposed in the second pixel region 104 of the substrate 100 and under the second organic light-emitting diode 108. In this embodiment, the first and second thin film transistors 110 and 112 may be randomly arranged in the second pixel region 104. Moreover, one of the first and second thin film transistors 110 and 112 may be electrically connected to the first organic light-emitting diode 106 and the other electrically connected to the second organic light-emitting diode 108. For example, the first thin film transistor 110 can be electrically connected to the first organic light-emitting diode 106 and the second thin film transistor 112 to the second organic light-emitting diode 108.

As shown in FIG. 2*b*, the first and second thin film transistors 110 and 112 may respectively comprise a gate electrode 111, a gate dielectric layer 113, an active layer 115 and source/drain electrodes 117. Moreover, a planarization layer 114, such as a silicon nitride layer is disposed the first and second thin film transistor 111 and 112 and the second organic light-emitting diode 108. The second thin film transistor 112 is electrically connected to the overlying second organic light-emitting diode 108 via a conductive layer 116 disposed in the planarization layer 114.

The double-sided organic electro-luminescent device 200 of the invention may be applied in various electronic devices with display capability, such as personal digital assistants (PDAs), display monitors, digital cameras or cellular phones.

According to the invention, since the thin film transistors are disposed in the pixel region comprising the top-emitting light-emitting diode, the aperture ratio of the adjacent bottom-emitting light-emitting diode can be increased. Accordingly, compared to the conventional double-sided organic electro-luminescent device, the brightness of the organic electro-luminescent device is increased, extending the lifetime thereof.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A double-sided organic electro-luminescent device, comprising:
    a substrate having a first pixel region and a second pixel region adjacent thereto;
    first and second organic light-emitting diodes disposed in the first and second pixel regions, respectively, wherein the light-emitting direction of the first organic light-emitting diode is opposite that of the second organic light-emitting diode; and
    first and second thin film transistors disposed in the second pixel region and under the second organic light-emitting diode, such that the first and second thin film transistors are covered by the second organic light-emitting diode as viewed from a top-view perspective, wherein the first thin film transistor is electrically connected to the first organic light-emitting diode and the second thin film transistor is electrically connected to the second organic light-emitting diode.

2. The device as claimed in claim 1, wherein the first organic light-emitting diode comprises a bottom-emitting organic light-emitting diode, and the second organic light-emitting diode comprises a top-emitting organic light-emitting diode.

3. The device as claimed in claim 2, wherein the bottom-emitting organic light-emitting diode comprises:
    a transparent electrode disposed on the substrate;
    an organic material layer disposed on the transparent electrode; and
    a metal reflective electrode disposed on the organic material layer.

4. The device as claimed in claim 2, wherein the top-emitting organic light-emitting diode comprises:
    a metal reflective electrode disposed over the first and second thin film transistors;
    a first transparent electrode disposed on the metal reflective electrode;
    an organic material layer disposed on the first transparent electrode; and
    a second transparent electrode disposed on the organic material layer.

5. The device as claimed in claim 1, wherein the first and second pixel regions are configured to display the same primary color.

6. The device as claimed in claim 5, wherein the first and second pixel regions form a sub-pixel region.

7. An electronic device comprising a double-sided organic electro-luminescent device as claimed in claim 1.

* * * * *